United States Patent

[11] 3,626,336

[72] Inventor Martin E. Levin
Menlo Park, Calif.
[21] Appl. No. 27,624
[22] Filed Apr. 13, 1970
[45] Patented Dec. 7, 1971
[73] Assignee Varian Associates
Palo Alto, Calif.

[54] HEAT DISSIPATING STRUCTURE FOR CAVITY RESONATOR TUNING ACTUATOR
9 Claims, 4 Drawing Figs.

[52] U.S. Cl. .......... 333/83 R, 333/83 T
[51] Int. Cl. .......... H01p 7/06, H01p 1/30
[50] Field of Search .......... 333/83 T, 82 BT, 82 B, 82 R, 83 R; 315/5.53, 5.54

[56] References Cited

UNITED STATES PATENTS

| | | | |
|---|---|---|---|
| 2,533,912 | 12/1950 | Bels .......... | 333/82 BT |
| 2,544,674 | 3/1951 | Hagen et al. .......... | 332/82 BT |
| 2,996,690 | 8/1961 | St. Clair .......... | 333/82 T |
| 3,209,200 | 9/1965 | Nelson et al. .......... | 333/83 T |
| 3,394,283 | 7/1968 | Mann .......... | 333/83 X |

*Primary Examiner*—Herman Karl Saalbach
*Assistant Examiner*—Wm. H. Punter
*Attorney*—Stanley Z. Cole

ABSTRACT: A tunable cavity resonator structure is disclosed having a tuning member movable within the cavity for tuning same. A tuner actuator structure is affixed to the tuning member and extends out of the cavity through an apertured wall thereof for effecting movement of the tuner. A thermally conductive stem, separate from the tuner actuator member, is affixed to the movable tuning member and extends out of the cavity through the apertured wall for conducting heat from the tuning member to the surrounds. The tuner actuator member is made of a material having a low coefficient of thermal expansion to eliminate temperature dependent tuning effects.

INVENTOR.
MARTIN E. LEVIN

BY Stanley Z. Cole
ATTORNEY

INVENTOR.
MARTIN E. LEVIN
BY
ATTORNEY

HEAT DISSIPATING STRUCTURE FOR CAVITY RESONATOR TUNING ACTUATOR

DESCRIPTION OF THE PRIOR ART

Heretofore, cavity resonators have been tuned by means of a turning member movable within the resonator and having an actuator member extending out of the resonator through an apertured wall of the cavity. However, in these prior tuners which have employed air cooling, the tuner actuator member was made of a material having a relatively high-thermal conductivity such that thermal energy could be conducted via the actuator member to the outside of the tube for dissipation to the surrounds. In this type of a tuner structure, the actuator member, typically copper, had a relatively high coefficient of thermal expansion and, thus, introduced substantial temperature dependent tuning effects which it is desired to eliminate.

SUMMARY OF THE PRESENT INVENTION

The principal object of the present invention is the provision of an improved cavity resonator tuner and tubes using same.

One feature of the present invention is the provision, in a tunable cavity resonator structure, of a tuning member disposed within the cavity for tuning thereof, such tuner member having both a tuner actuator member and a thermally conductive stem member affixed thereto and extending out of the resonator through an apertured wall thereof, the tuner actuator member having a coefficient of thermal expansion substantially less than that of the more thermally conductive stem member, whereby cooling of the tuner member is effected by a structure independent of the tuner actuator structure to eliminate temperature dependent tuning effects.

Another feature of the present invention is the same as the preceding feature wherein the tuner actuator member is made of molybdenum and the conductive stem member is made of a material selected from the group consisting of copper and aluminum.

Another feature of the present invention is the same as any one or more of the preceding features wherein a bellows or diaphragm is disposed surrounding both the tuner actuator member and thermally conductive stem member for sealing the movable tuning member to the wall of the cavity in a vacuum tight manner.

Another feature of the present invention is the same as the immediately preceding feature including the provision of a fluid passageway extending lengthwise of the thermally conductive stem to provide a passageway for a stream of fluid coolant connected into fluid communication with a region adjacent the walls of the bellows for cooling the bellows in use.

Other features and advantages of the present invention will become apparent upon a perusal of the following specification taken in connection with the accompanying drawings wherein:

DESCRIPTION OF THE PREFERRED EMBODIMENTS

Figure 1:
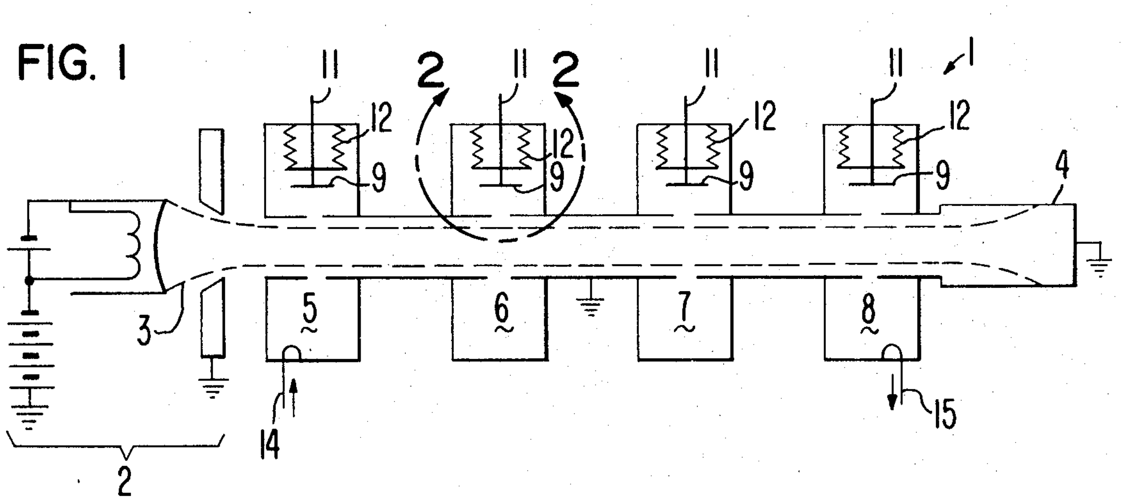
FIG. 1 is a schematic line diagram of a multicavity klystron tube incorporating features of the present invention.

Referring now to FIG. 1, there is shown a klystron amplifier tube 1 incorporating features of the present invention. The tube 1 includes an electron gun assembly 2 for forming and projecting a stream of electrons 3 over an elongated beam path to a beam collector structure 4 disposed at the terminal end of the beam. A plurality of cavity resonators 5, 6, 7, and 8 are successively disposed along the beam path for electromagnetic interaction with the beam. Each cavity includes a tuner structure 9 having an actuator member 11 extending out of the cavity through an apertured wall thereof, such tuner actuator member 11 being sealed to the wall of the cavity in a vacuum-tight manner via the intermediary of a flexible bellows 12.

Microwave energy to be amplified is applied to the upstream cavity 5 via the intermediary of an input coupling loop 14 for exciting the fields of the input resonator 5. The electric field of cavity 5 acts with the electrons of the beam, in the first interaction gap, for velocity modulating the beam passable therethrough. Floating resonators 6 and 7 are excited by the modulated beam passable therethrough and they further interact back on the electron beam 3 to produce a favorable bunching of the electrons at the interaction gap of the output resonator 8.

The bunched electrons passing through the gap of the output resonator 8 excite the resonator and microwave power is extracted from the resonator via output coupling loop 15 and fed to a suitable utilization device such as an antenna, not shown. The cavity resonators 5–8 are tuned to frequencies in the general vicinity of the passband of the tube 1 via the tuner members 9. The operating passband of frequencies of the tube 1 can be changed by changing the tuning of the various cavities by effecting movement of the tuning members 9 within the various cavities.

Figure 2:
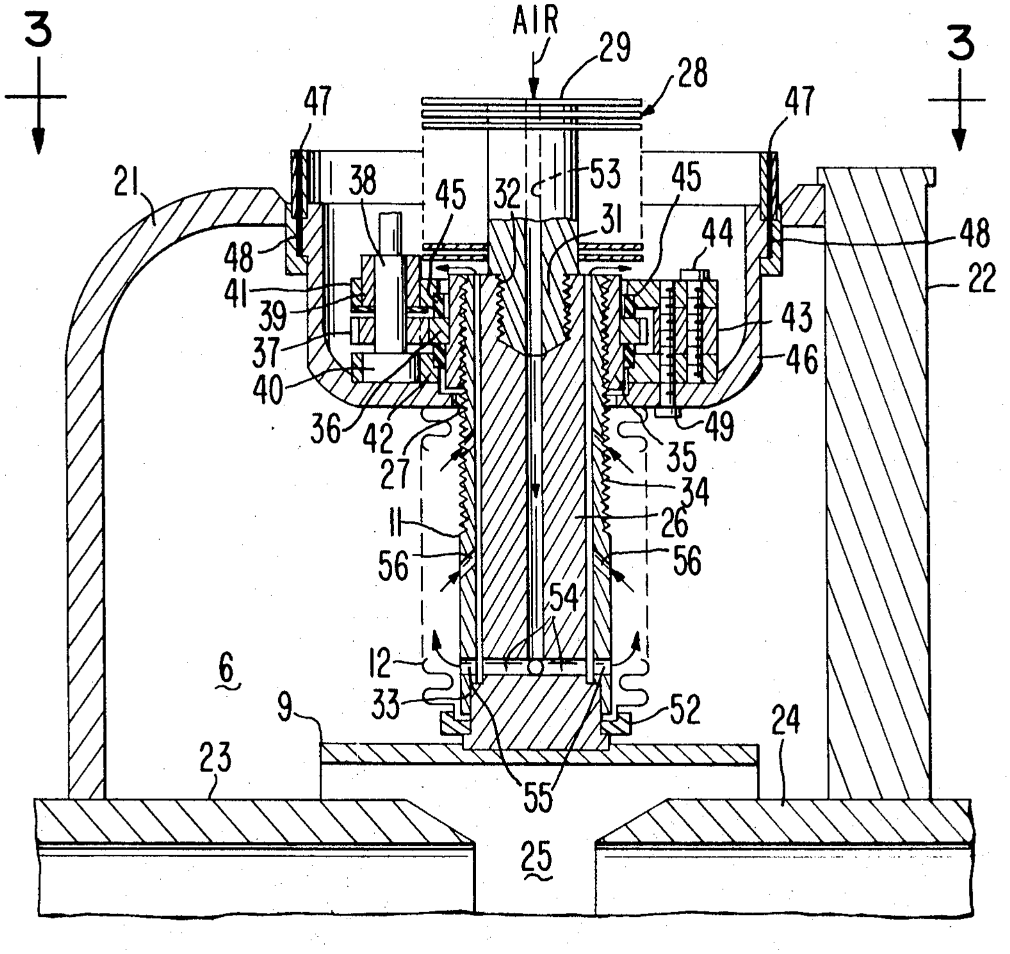
FIG. 2 is an enlarged sectional view of a portion of the structure of FIG. 1 delineated by line 2—2.
Figure 3:
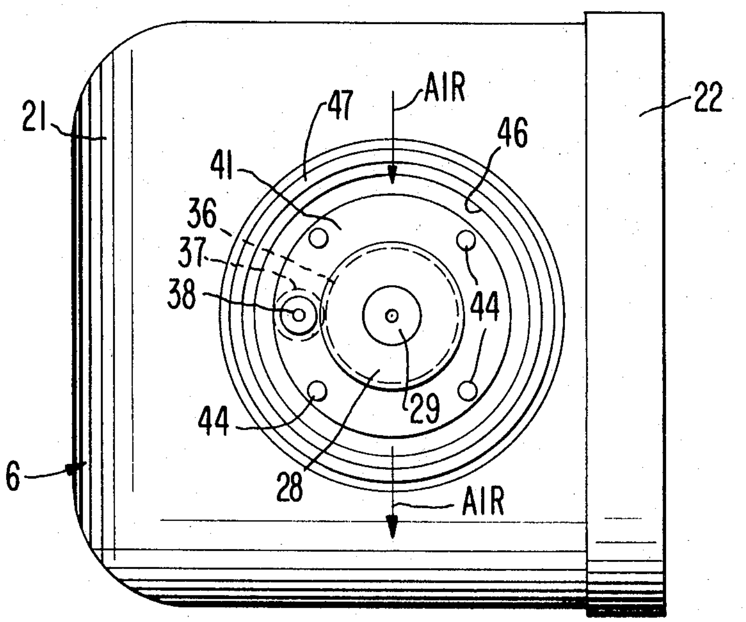
FIG. 3 is a view of the structure of FIG. 2 taken along line 3—3 in the direction of the arrows.

Referring now to FIGS. 2 and 3, the details of the tuning structure will be more fully described. The cavity resonator 6 includes a cup-shaped electrically conductive member 21 forming the cylindrical sidewalls and one end wall of the cavity 6. The open end of the cup 21 is closed by a circular disc-shaped electrically conductive end wall 22 sealed to the cup 21, as by brazing. A pair of reentrant drift tube members 23 and 24, as of copper, project axially of the cavity 6 from the end walls 21 an 22 to define a beam-field interaction gap 25 in the space between the free ends of the reentrant members 23 and 24.

A saddle-shaped capacitive tuning member 9, such as that disclosed in U.S. Pat. No. 2,963,616 issued Dec. 6, 1960, is disposed adjacent the interaction gap 25 bridging across the space between ends of the reentrant drift tube members 23 and 24 in the region of intense electric field of the excited resonator for displacing a variable amount of the electric field to tune the resonator 6. Typically, the tuning member 9 is made of copper.

A thermally conductive stem 26, as of copper, aluminum, gold, or silver is affixed at its inner end to the tuning member 9, as by brazing, and extends out of the cavity 6 through an aperture 27 in the wall thereof. An array of cooling fins 28, as of aluminum, are affixed to the outer extremity of the stem 26 for dissipating thermal energy conducted to the fins 28 to the surrounds. In particular, an airstream may be directed across the fins 28 for cooling of the tuner 9. The fins 28 are formed on a central core member 29 which projects at 31 below the fin array to form a stud which is threaded into a tapped bore 32 in the outer extremity of the stem 26.

A tubular tuner actuator sleeve 11, which is made of a material having a low coefficient of thermal expansion, such as molybdenum or tungsten, is affixed to the stem 26 as by brazing, at a point 33 which is very near to the tuning member 9, such that for practical purposes the tuner actuator sleeve 11 is fixed essentially directly to the tuning member 9. The tuner actuator sleeve 11 coaxially surrounds the stem 26 and extends out of the resonator 6 through the aperture 27. The outside of the tuner actuating sleeve 11 is threaded at 34 to mate with the internal threads of a captured nut 35, as of brass. A brass gear 36 is affixed to the periphery of the nut 35. Gear 36 mates with a drive gear 37, as of brass, affixed to a rotatable tuner drive shaft 38. The rotatable tuner drive shaft 38 is supported by a pair of nylon bearings 39 and 40, respectively, carried in apertures in a pair of support plates 41 and 42, as of brass.

The support plates 41 and 42 are held apart by a plurality of tubular spacers 43 and the two plates are held together by means of screws 44 spaced at intervals about the periphery of the plates. A pair of nylon thrust bearings 45 coaxially surround the captured nut 35 and are carried in a pair of circular recesses in the support plates 41 and 42. Thrust bearings 45 ride upon the gear 36, thereby capturing the gear 36, and nut 35 against axial translation. The tuner support plates 41 and 42 are affixed to a cup-shaped insert 46, as of copper which is sealed at its outer lip at 47, as by welding to a circular aperture 48 in the sidewall 21 of the cavity 6. Inwardly projecting insert cup 46 forms a portion of the inside wall of the resonator 6. The tuner support plates 41 and 42 are affixed to the bottom wall of the cup-shaped insert 46, as by screws 49 disposed at intervals around the periphery of the plates 41 and 42.

Movement of the tuning member 9 within the cavity is effected by rotation of the tuner drive shaft 38 which in turn produces rotation of the captured nut 35 which causes axial translation of the tuner actuating sleeve 11 and dependent tuning member 9. The flexible metallic bellows 12, as of monel, is sealed at one end to the lip of aperture 27 in the insert 46 and at the other end to an adapter ring 52 at the inner extremity of the tuner cooling stem 26 for sealing the tuner actuator sleeve 11, stem 26 and tuning member 9 to the inside wall of the cavity 6 in a vacuumtight manner.

The thermally conductive cooling stem 26 is recessed at its outer periphery for substantially its entire length to provide an annular space between the stem 26 and tuner actuating sleeve 11 such that thermal expansion of the stem 26 is essentially independent of the thermal expansion characteristics of the low-expansion tuner actuating sleeve 11. In this manner, temperature dependent tuning effects are eliminated because the tuner member 9 is actuated and supported substantially entirely via the intermediary of the low-thermal expansion tuner actuating sleeve 11, while the thermally conductive stem 26 readily permits conduction of thermal energy from the tuning member 9 to the cooling fins 28 for dissipation to the surrounds.

When the tube 1 is operating at very high-power levels or when the tuner structure is operating in the output resonator 8 it may be desireable to provide cooling of the bellows 12. In this case, an axially directed air-coolant passageway 53 is provided extending axially of the cooling stem 26. At the inner extremity of the coolant passageway 53 a plurality of radial bores 54 intersect with the axial passageway for conducting the cooling air radially of the stem to a plurality of ports 55 provided in the actuator sleeve 11, such that the cooling air can pass through the ports 55 into the annular region adjacent the inside wall of the bellows 12 for cooling same. A second set of ports 56 are provided in the tuner actuating sleeve 11 to permit passage of the cooling air from the region adjacent the bellows into the annular space between the stem 26 and the sleeve 11 for exhausting the coolant air through such annular passageway to the surrounds.

Figure 4:
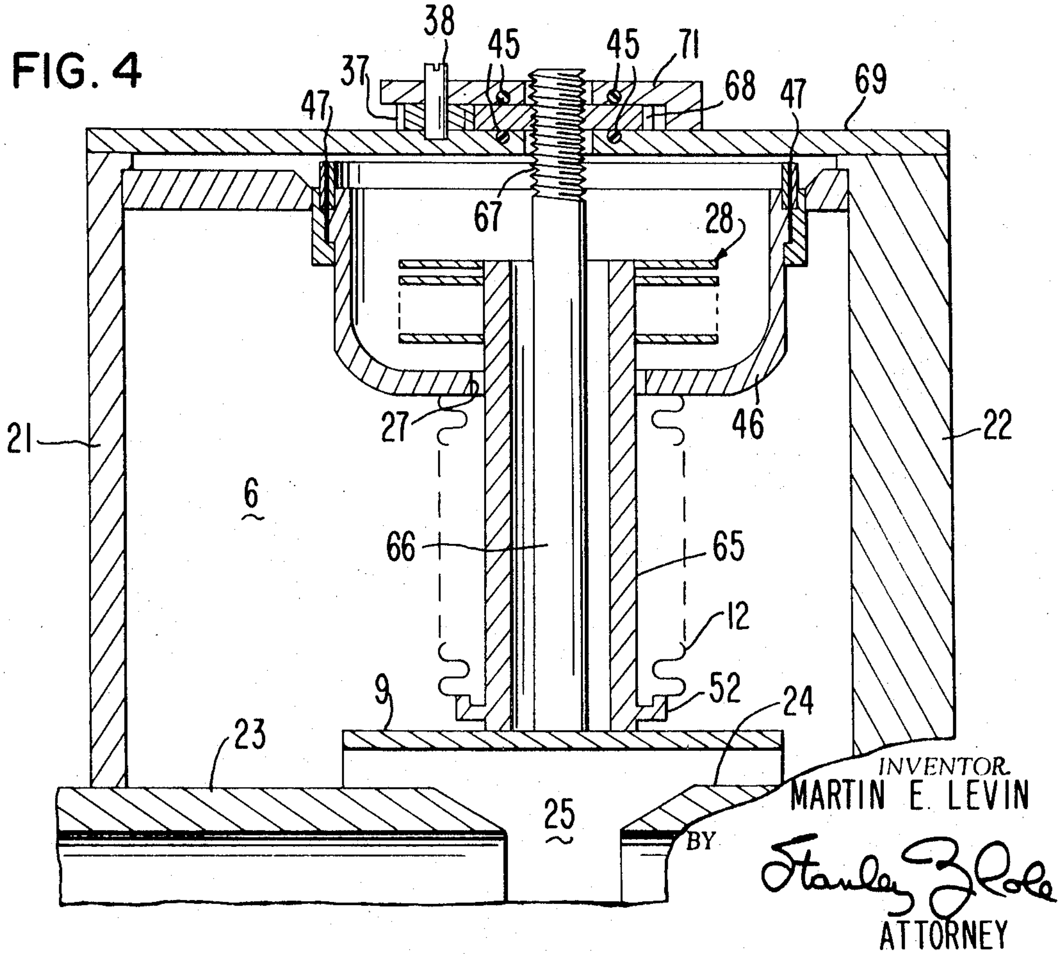
FIG. 4 is a view similar to that of FIG. 2 depicting an alternative embodiment of the present invention.

Referring now to FIG. 4, there is shown an alternative embodiment of the structure of FIG. 2. The structure of FIG. 4 is substantially the same as that of FIG. 2 with the exception that the tuner-cooling stem is formed by a hollow cylindrical thermally conductive member 65 as of copper or aluminum, which is affixed, as by brazing, at its inner end to the tuner member 9 and which extends out of the cavity 6 through aperture 27 in the insert cup 46. The array of cooling fins 28 is affixed to the outer extremity of the tubular-cooling stem 65 for dissipating heat to the surrounds. The tuner actuator member comprises a rod 66 centrally disposed of the tubular tuner stem 65, such rod 66 being affixed, as by brazing, to the tuning member 9 for effecting movement thereof and extending out of the resonator through the aperture 27. The outer extremity of the tuner-actuating rod 66 is threaded at 67 to mate with internal threads of a gear 68 captured to a support plate 69 via clamp 71 affixed to plate 69 which in turn is affixed to the outside wall of the cavity 6. The tuner drive gear 37, as carried upon rotatable drive shaft 38, mates with captured nut 68 for turning the captured nut 68 to effect translation of the tuner actuator rod 66.

The tuner actuating rod 66 is made of a material having a low coefficient of linear thermal expansion, such as molybdenum or tungsten, whereas the thermally conductive cooling stem 65 is made of a material having high-thermal conductivity such as copper or aluminum. As in the embodiment of FIG. 2 thermal detuning effects are eliminated while permitting cooling of the tuning member 9 by making the thermal expansion of the tuning actuator rod 66 independent of the thermal expansion of the cooling stem 65.

Since many changes could be made in the above construction and many apparently widely different embodiments of this invention could be made without departing from the scope thereof, it is intended that all matter contained in the above description or shown in the accompanying drawings shall be interpreted as illustrative and not in a limiting sense.

What is claimed is:

1. In a tunable resonator structure, a cavity resonator, a tuning member movable within the said cavity for tuning said cavity, a tuner actuator structure coupled to said tuning member and extending therefrom to the outside of said cavity resonator through an apertured wall of the said cavity resonator, means for effecting movement of said actuator structure for tuning the said cavity resonator, a cooling structure connected in heat-exchanging relation with said tuning member and movable therewith, said cooling structure extending substantially from said tuning member to the outside of the said cavity resonator through the apertured wall of the said cavity resonator, said cooling structure being made of a material having a thermal conductivity substantially greater than that of said tuner actuator structure and being mounted for thermal expansion substantially independent of the thermal expansion of said actuator structure such that heat is conducted from said tuning member to the outside of the cavity resonator via a path substantially independent of said tuner actuator structure.

2. The apparatus of claim 1 wherein said tuner actuator structure has a coefficient of linear thermal expansion substantially less than that of said cooling structure.

3. The apparatus of claim 2 wherein a preponderance of the length of said tuner actuator structure within the cavity is made of molybdenum.

4. The apparatus of claim 2 wherein a preponderance of the length of said cooling structure within the cavity is made of a material selected from the group consisting of copper and aluminum.

5. The apparatus of claim 1 including a bellows extending into said cavity resonator and disposed surrounding said tuner actuator structure and said cooling structure for sealing said movable tuning member, said tuner actuator and said cooling structure in a vacuum-tight manner to a wall of said cavity resonator.

6. The apparatus of claim 1 wherein said tuner actuator structure and said cooling structure are disposed with one inside of the other in noncontacting relation over a preponderance of their lengths inside of said cavity resonator.

7. The apparatus of claim 1 including an array of thermally conductive fins affixed in heat-exchanged relation to said cooling structure externally of said cavity resonator for dissipating heat to the surrounds.

8. The apparatus of claim 1 including means for projecting a beam of electrons through said cavity resonator for electromagnetic interaction with the electric field of the cavity resonator for velocity modulating the beam passable therethrough.

9. The apparatus of claim 5 wherein said cooling structure includes a fluid passageway extending lengthwise thereof for providing a passageway for a stream of fluid coolant connected into fluid communication with a region of space adjacent the wall of said bellows for cooling said bellows.

* * * * *